(12) United States Patent
Hieda et al.

(10) Patent No.: US 8,974,682 B2
(45) Date of Patent: Mar. 10, 2015

(54) SELF-ASSEMBLED PATTERN FORMING METHOD

(71) Applicant: Kabushiki Kaisha Toshiba, Tokyo (JP)

(72) Inventors: Hiroyuki Hieda, Yokohama (JP); Yoshiyuki Kamata, Tokyo (JP); Naoko Kihara, Kawasaki (JP); Akira Kikitsu, Yokohama (JP); Ryosuke Yamamoto, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/930,262

(22) Filed: Jun. 28, 2013

(65) Prior Publication Data

US 2014/0097152 A1 Apr. 10, 2014

(30) Foreign Application Priority Data

Oct. 9, 2012 (JP) .................................. 2012-223814

(51) Int. Cl.
*B44C 1/22* (2006.01)
*G03F 7/34* (2006.01)

(52) U.S. Cl.
CPC ...................................... *G03F 7/343* (2013.01)
USPC .................. 216/41; 216/51; 216/56; 216/67; 438/710

(58) Field of Classification Search
CPC .................. B81C 1/00031; B81C 2201/0149; B82Y 40/00; B44C 1/22; H01L 21/0337
See application file for complete search history.

(56) References Cited

U.S. PATENT DOCUMENTS

| | | | |
|---|---|---|---|
| 2009/0135519 | A1 | 5/2009 | Hieda et al. |
| 2011/0147983 | A1 | 6/2011 | Cheng et al. |
| 2011/0147985 | A1 | 6/2011 | Cheng et al. |
| 2011/0255193 | A1 | 10/2011 | Hieda |

FOREIGN PATENT DOCUMENTS

| | | |
|---|---|---|
| JP | 2009-129501 | 6/2009 |
| JP | 2011-222103 | 11/2011 |

OTHER PUBLICATIONS

Y.S. Jung et al., "Nanofabricated Concentric Ring Structures by Templated Self-Assembly of a Diblock Copolymer", (Nano Letters, vol. 8, year 2008, pp. 2975-2981.*
Y.S. Jung et al., "Orientation-Controlled Self-Assembled Nanolithography Using a Polystyrene-Polydimethylsiloxane Block Copolymer", Nano Letters, vol. 7, year 2007, pp. 2046-2050.*
M.P. Stoykovich et al., "Directed Self-Assembly of Block Copolymers for Nanolithography: Fabrication of Isolated Features and Essential Integrated Circuit Geometries", ACS NANO, vol. 1, year 2007, pp. 168-175.*
Bita et al., "Graphoepitaxy of Self-Assembled Block Copolymers on Two-Dimentional Periodic Patterned Templates", *Science*, vol. 321, Aug. 15, 2008, pp. 939-943.
Cheng et al., "Simple and Versatile Methods to Integrated Directed Self-Assembly with Optical Lithography Using a Polarity-Switched Photoresist", *ACS Nano*, vol. 4, No. 8, 2010, pp. 4815-4823.

* cited by examiner

*Primary Examiner* — Lan Vinh
*Assistant Examiner* — Jiong-Ping Lu
(74) *Attorney, Agent, or Firm* — Nixon & Vanderhye, P.C.

(57) ABSTRACT

A self-assembled pattern forming method in an embodiment includes: forming a guide pattern on a substrate; forming a layer of a first polymer; filling a first block copolymer; and phase-separating the first block copolymer. The guide pattern includes a first recessed part having a depth T and a diameter D smaller than the depth T, and a second recessed part having a width larger than double of the diameter D. The first block copolymer has the first polymer and a second polymer which are substantially the same in volume fraction. By phase-separating the first block copolymer, a cylinder structure and a lamellar structure are obtained.

18 Claims, 8 Drawing Sheets

FIG. 7

SELF-ASSEMBLED PATTERN FORMING METHOD

CROSS REFERENCE TO RELATED APPLICATION

This application is based upon and claims the benefit of priority from the prior Japanese Patent Application No. 2012-223814, filed on Oct. 9, 2012; the entire contents of which are incorporated herein by reference.

FIELD

Embodiments described herein related generally to a self-assembled pattern forming method.

BACKGROUND

A self-assembled pattern forming method using a block copolymer is expected as a method of producing a recording device such as a bit patterned medium. The bit patterned medium has dots of magnetic material for each predetermined number of bits (for example, one bit) and is promising as a future recording medium of a hard disk drive. A regular array of dots in a large area with less array defects can be formed in a high density by making the block copolymer self-assemble while starting from dummy guide dots.

Here, the dummy guide dot needs to have a small size at the same level as that of the pattern to be formed by the self-assembly. The dummy guide dot can be produced by photolithography or electron-beam lithography. In this case, however, the advantage of miniaturization by the self-assembly cannot be sufficiently exhibited because of a problem of the resolution of a lithography device.

To solve this problem, a technique of reducing the size of the pattern produced by the lithography to obtain a fine pattern has been developed. The pattern formed by the lithography can be reduced in size by using a self-assembling material. By using this method for dummy guide dot array formation, the dummy guide dot exceeding the limit of the lithography can be formed.

Incidentally, in the recording device such as the bit patterned medium, it is necessary to form a pattern with a large size (for example, a positioning pattern (in the case of the bit patterned medium), a wiring pattern (in the case of the electronic device)) in addition to a pattern of fine dots.

However, it is not always easy to produce on the same substrate both of the fine dot pattern and the pattern with a size larger than that of the dot by the method using self-assembly.

DETAILED DESCRIPTION

A self-assembled pattern forming method in an embodiment includes: forming a guide pattern on a substrate; forming a layer of a first polymer; filling a first block copolymer; and phase-separating the first block copolymer. The guide pattern includes a first recessed part having a depth T and a diameter D smaller than the depth T, and a second recessed part having a width and a length which are larger than double of the diameter D. A layer of the first polymer is formed on inner walls of the first and second recessed parts. The first block copolymer has the first polymer and a second polymer which are substantially the same in volume fraction, and is filled inside the first and second recessed parts. By phase-separating the first block copolymer, a cylinder structure disposed inside the first recessed part and having a columnar body of the second polymer and a cover body of the first polymer covering the columnar body, and a lamellar structure disposed inside the second recessed part and having layers of the first and second polymers are obtained.

Figure 1:
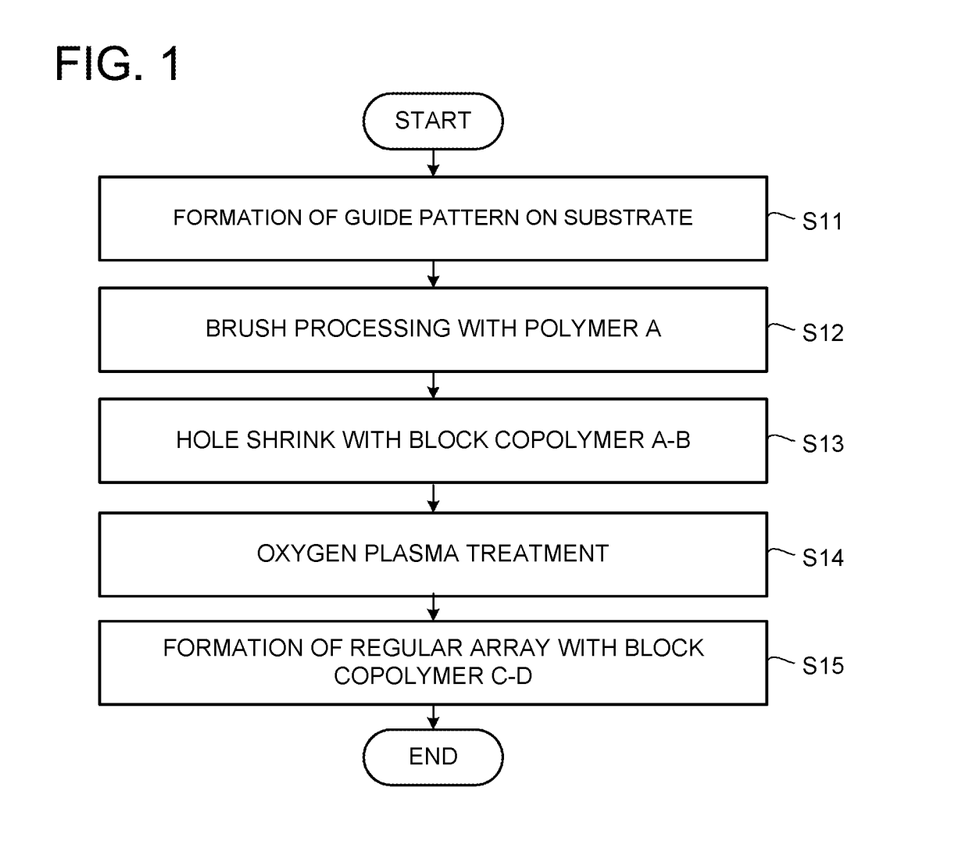
FIG. 1 is a flowchart illustrating the flow of a self-assembled pattern forming method according to an embodiment.

Hereinafter, embodiments of the present invention are described referring to the drawings. FIG. 1 illustrates a schematic flow of forming a self-assembled pattern in an embodiment. FIG. 2 to FIG. 6 are schematic top views and sectional views illustrating the self-assembled pattern in process of production.

Figure 2:
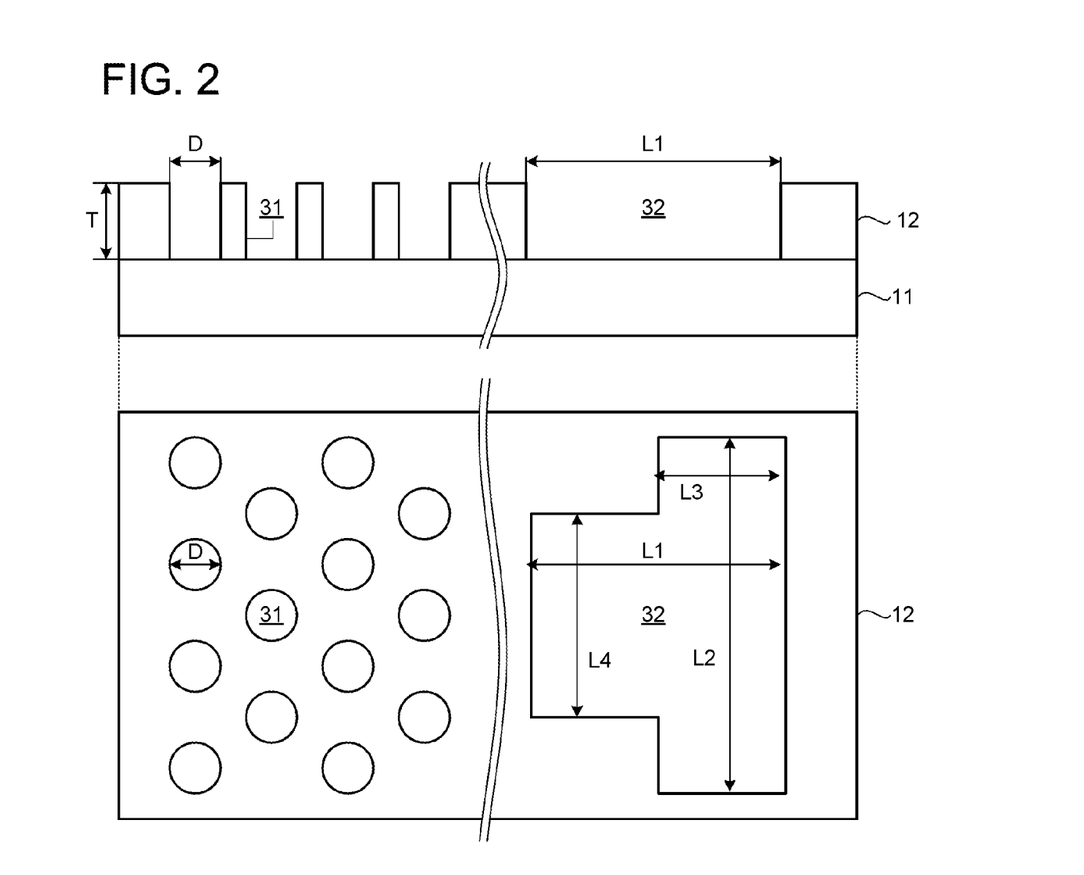
FIG. 2 is a top view and a sectional view illustrating a self-assembled pattern in process of production.

(1) Production of a Guide Pattern 12 on a Substrate 11 (Step S11, see FIG. 2)

A guide pattern 12 is formed on a substrate 11. The guide pattern 12 can be produced by forming and patterning a resist layer on the substrate 11. For the patterning, photolithography, electron-beam lithography, nanoimprint lithography or the like can be used.

Here, it is preferable to use a carbon-based resist as the resist layer. The reason why the carbon-based resist is used is that the resist layer can be removed by oxygen plasma treatment. In the case of using an electron-beam resist, for example, a positive resist material such as PMMA, ZEP520A or the like can be used.

The guide pattern 12 has recessed parts 31, 32. The recessed part 31 is in a substantially column shape having a depth T and a diameter D smaller than the depth T. This is to facilitate the production of a cylinder (column) structure at subsequent Step S13. The recessed part 32 has a width L3 larger than double of the diameter D of the recessed part 31. This is to facilitate production of a lamellar (layer) structure at subsequent Step S13.

The width L3 is the distance measured in the vertical direction from an edge (side wall of a groove) of the guide pattern 12 to an edge of the guide pattern opposed thereto. As described later, the width L3 is the minimum value (minimum width) among a plurality of widths L1 to L4 of the recessed part 32.

The recessed part 32 is a groove (recess) with a substantially constant depth T. The recessed part 32 has a spread in two dimensions larger than the depth T, and is roughly in a substantially rectangular shape having the width L1 and the length (width) L2. In more detail, the recessed part 32 can also be described as a combination of the above shape and a rectangular shape with the widths L3, L4.

In short, the recessed part 32 has the plurality of widths L1 to L4, and the minimum width among the widths L1 to L4 is the minimum dimension (smallest dimension) of the recessed part 32. Here, the width L3 is smaller than any of the widths L1, L2, L4, and has the minimum dimension (minimum width) of the recessed part 32.

Here, in FIG. 2, the directions of the widths L1, L3 (and the directions of the widths L2, L4) are substantially parallel to each other. Further, the directions of the widths L1, L2 (and the directions of the widths L3, L4) are substantially perpendicular to each other. However, the parallel and perpendicular relations are not necessary. For example, part or all of the widths L1 to L4 may be oblique to each other. In this case, the shape or the like formed by the widths L1, L2 is not the substantial rectangle but a substantial parallelogram.

Even if the directions of the plurality of widths L1 to L4 are not parallel or perpendicular to each other unlike the above, the minimum value (minimum width) of them larger than double of the diameter D of the recessed part 31 facilitates production of the lamellar (layer) structure at subsequent Step S13.

As described above, the top of the guide pattern 12 is divided into regions (a region of a hole pattern (fine pattern) and a region of a recess pattern with a large size (wide pattern)) where the recessed parts 31, 32 corresponding to the cylinder (column) structure and the lamellar (layer) structure are arranged.

Figure 3:
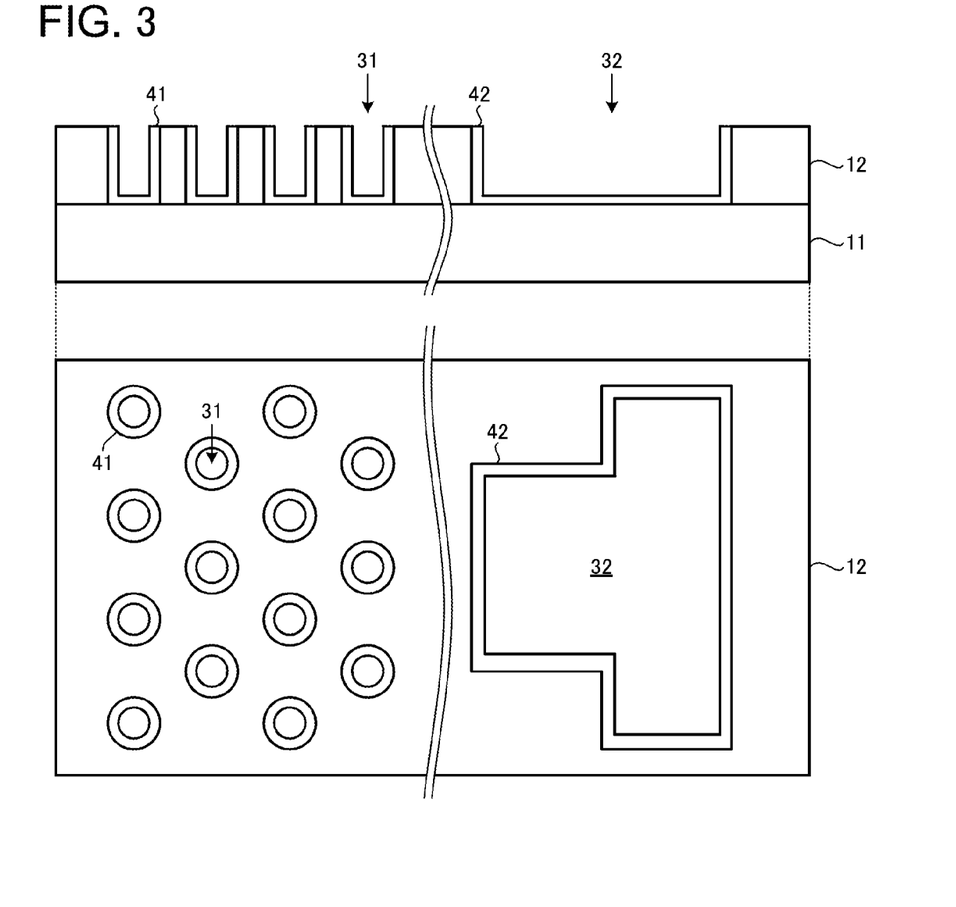
FIG. 3 is a top view and a sectional view illustrating the self-assembled pattern in process of production.

(2) Brush Processing with a Polymer A (Step S12, see FIG. 3)

On the surface of the guide pattern 12, brush films of a polymer A (layers of the polymer A) 41, 42 are formed. More specifically, the brush films 41, 42 are formed on inner walls of the recessed parts 31, 32 respectively.

The formation of the brush films 41, 42 has two purposes. The formation of the brush films 41, 42 of the polymer A improves the affinity with a block copolymer to facilitate self-assembly of the block copolymer at Step S13. Further, the self-assembly in different structures in the recessed parts 31, 32 also becomes possible. Note that the details are described later.

The polymer A used as the brush films 41, 42 contains a polymer component in common with the block copolymer (a diblock copolymer in which the polymer A and a polymer B are combined together) used at Step S13. In other words, the polymer A is formed from the same monomer as in the polymer A of the block copolymer A-B.

The polymer A is preferably removable by oxygen plasma. The polymer A can be selected from among carbon-based polymers such as polybutadiene, polymethyl methacrylate, polyethylene, poly-t-butyl methacrylate, polyisoprene, polystyrene, poly-N,N-dimethylacrylamide, polyethylene oxide, polyacrylic acid, polymethacrylic acid and so on.

The polymer B is preferably highly resistant to oxygen plasma. As the polymer B, a polymer in which metal elements such as silicon are contained within a main chain or a side chain, such as polydimethylsiloxane, polysilicon, silsesquioxane or the like can be selected.

The block copolymer (self-assembling material) may be an A-B type diblock copolymer or may be an A-B-A type or B-A-B type triblock copolymer.

The polymer A used as the brush films 41, 42 preferably has, at the terminal of a polymer chain, a functional group adsorbed to the surface of the guide pattern 12 (resist). This enables stable bonding between the guide pattern 12 and the brush films 41, 42 of the polymer A. The functional group can be selected from among the hydroxy group, the carboxyl group, the amino group, the trimethoxysilane group and so on.

Specifically, the brush films 41, 42 of the polymer A can be formed as follows. Heating after a solution of the polymer A is applied to the guide pattern 12 bonds the functional group at the terminal of the polymer A and the resist surface. As a result of this, the brush films 41, 42 can be formed on the inner walls of the recessed parts 31, 32 of the guide pattern 12 respectively. Thereafter, a solvent is used to rinse the substrate 11 to thereby remove the polymer A not bonding to the surface of the guide pattern 12.

Here, the solvent in the solution of the polymer A may dissolve the resist to break the guide pattern 12. In this case, it is preferable to coat the surface of the guide pattern 12 (resist layer) with a material insoluble to the solvent before the application of the solution of the polymer A. It is possible to make the resist layer insoluble to the solvent, for example, by forming a very thin film of carbon by the sputtering method.

Figure 4:
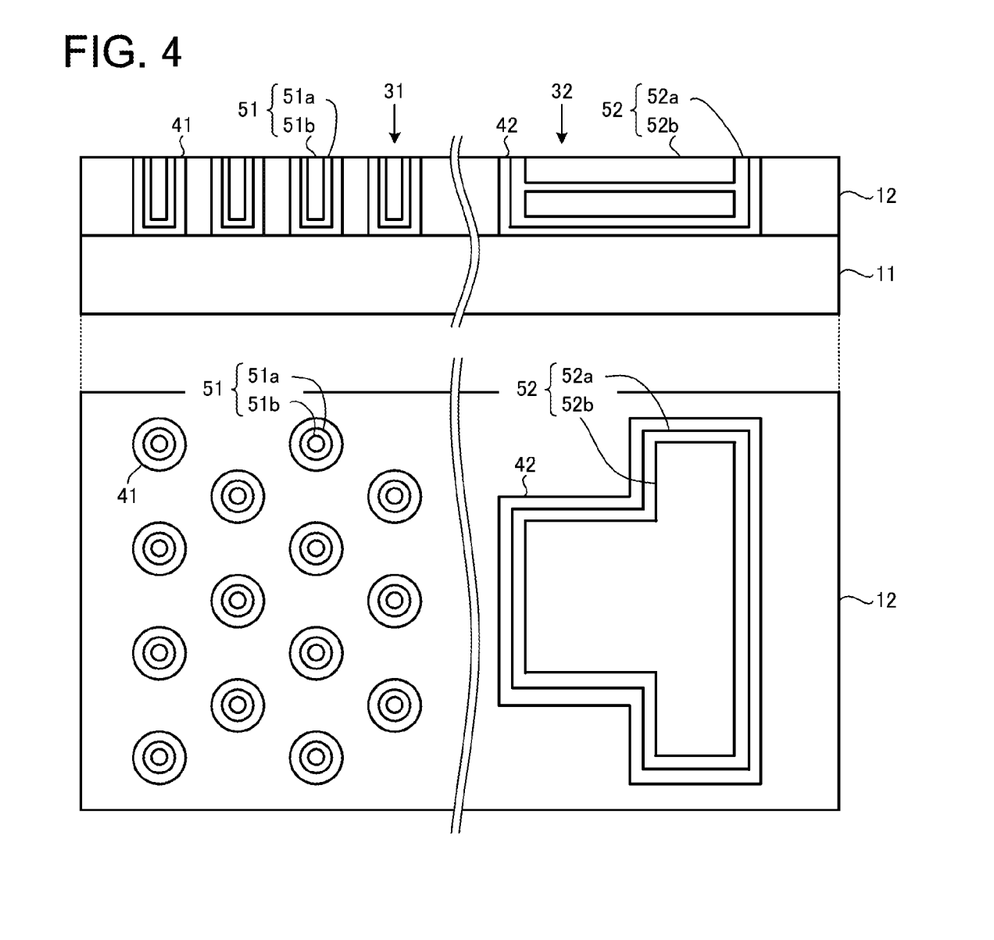
FIG. 4 is a top view and a sectional view illustrating the self-assembled pattern in process of production.

(3) Hole Shrink with the Block Copolymer A-B (Step S13, see FIG. 4)

Making the block copolymer A-B self-assemble as follows enables miniaturization of the fine pattern region of the guide pattern 12.

1) Filling of the Block Copolymer

The block copolymer composed of the polymer A and the polymer B is filled in the recessed parts 31, 32. Application of the block copolymer enables the block copolymer to be filled in the recessed parts 31, 32. In this event, the block copolymer in which the volume fractions of the polymer A and the polymer B are at the same level being 50% is used. In short, the block copolymer with a composition which easily forms the lamellar structure is used. The volume fraction at the same level means a range of 40% to 60%. In this range, the block copolymer forms the lamellar structure.

2) Phase Separation of the Block Copolymer (Self-Assembly)

The block copolymer filled in the recessed parts 31, 32 is phase-separated. The block copolymer is phase-separated by facilitating movement of the molecules in the block copolymer A-B by thermal annealing (heating) or exposure to a solvent atmosphere.

As illustrated in FIG. 4, the phase separation state of the block copolymer is different between the region of the hole pattern (region where the recessed part 31 is formed) and the region of the recess pattern with a large size (region where the recessed part 32 is formed). In the recessed parts 31, 32, a cylinder structure 51 and a lamellar structure 52 are formed respectively.

The reason why the phase separation state of the block copolymer is different between the region of the hole pattern (region where the recessed part 31 is formed) and the region of the recess pattern with a large size (region where the recessed part 32 is formed) is that the volume fraction of the polymer A with respect to that of the polymer B is different between the recessed parts 31 and 32.

The volume fraction of the polymer A is effectively large in the recessed part 31. This is because, as the polymer A inside the recessed part 31, both of the polymer A in the brush film 41 and the polymer A in the block copolymer A-B filled therein are to be considered. The effectively large volume fraction of the polymer A causes the cylinder structure to be easily formed inside the recessed part 31, resulting in formation of the vertically oriented cylinder of the polymer B. As a result of this, the diameter of the hole pattern can be reduced.

The above shows that a ratio R between a volume V1 of the polymer A in the brush film 41 and a volume V2 of the polymer A in the block copolymer A-B inside the recessed part 31 is important. Specifically, the volume V1 is preferably one to five times the volume V2 (ratio R=1 to 5). If the ratio R falls outside the range, the cylinder structure becomes hard to form inside the recessed part 31.

Note that, in terms of the thickness of the brush film 41, the thickness is preferably within a certain range with respect to the diameter D of the recessed part 31. Incidentally, since the brush film 41 is formed also at the bottom of the recessed part 31, the depth T is also related to the ratio R.

In contrast, the volume fraction of the polymer A is not likely to effectively increase in the recessed part 32. This is because the contribution of the polymer A in the brush film 42 inside the recessed part 32 relatively decreases (for example, the ratio of the volume of the brush film 42 to the volume inside the recessed part 32 decreases) because the recessed part 32 is large in size. As has been described, the recessed part 31 has the depth T and the diameter D smaller than the depth T. On the other hand, the recessed part 32 has the width L1 and the length L2 which are larger than double of the diameter D of the recessed part 31.

As a result, in the recessed part 32, the phase separation state of the block copolymer is actually determined depending on the volume fractions of the polymer A and the polymer B in the block copolymer A-B filled therein. As a result of this, the layer lamellar structure is obtained but the cylinder structure is not formed inside the recessed part 32.

The cylinder structure 51 includes a domain (columnar body) 51b of the polymer B formed in a column shape (for example, a circular column shape) in the film thickness direction, and a domain (cover body) 51a of the polymer A surrounding the columnar body. The domain 51b in the column shape (for example, the circular column shape) has a diameter smaller than the diameter D of the recessed part 31.

The lamellar structure 52 has a domain (layer)) 52a of the polymer A and a domain (layer) 52b of the polymer B which are layered in the film thickness direction.

As described above, the block copolymer A-B is used for forming the guide pattern (the domain 51b in the column shape) having a diameter smaller than the diameter D of the hole pattern (recessed part 31). Accordingly, a pitch P for one cycle of the phase separation pattern of the block copolymer A-B needs to be smaller than the diameter D of the hole pattern. Ideally, a relation of P<D<2P is preferable. The diameter D smaller than double (2P) of the pitch P prevents formation of a plurality of domains of the polymer B inside the hole pattern (recessed part 31). As a result of this, it is possible to reduce only the diameter D of the recessed part 31 without actually changing the shape of the recessed part 32.

As described above, in this embodiment, the sizes of the patterns are made different as in the fine pattern (hole pattern) and the wide pattern (recess pattern with a large size), thereby making it possible to differ the phase separation structures to be formed.

Generally, for the block copolymer (self-assembling material), a block copolymer with a composition of forming a cylinder structure or a micelle structure in order to form dots (columnar body, spherical body). Therefore, the cylinder structure or the micelle structure is formed in the wide pattern portion and possibly inhibits maintenance of the two-dimensional shape of the wide pattern. In contrast, it is possible to maintain the wide pattern while reducing the fine pattern in size in this embodiment.

Figure 5:
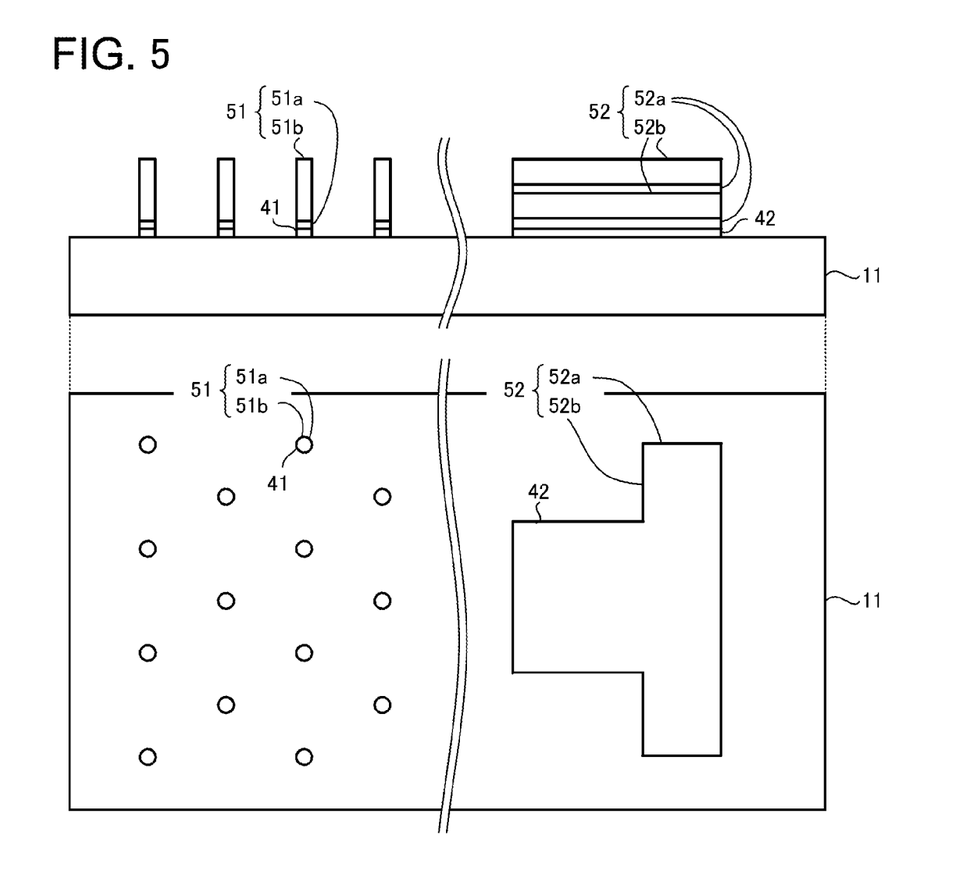
FIG. 5 is a top view and a sectional view illustrating the self-assembled pattern in process of production.

(4) Oxygen Plasma Treatment (Step S14, see FIG. 5).

The substrate 11 is subjected to oxygen plasma treatment. As a result of this, as illustrated in FIG. 5, the resist layer (the guide pattern 12) and most of the polymer A (the polymer A forming the brush films 41, 42 and the domains 51a, 52a of the polymer A in the block copolymer) are removed so that the domains 51b of the polymer B are left. In short, the isolated domains 51b of the polymer B are formed.

The isolated domains 51b of the polymer B form a guide pattern controlling the array of a block copolymer C-D which will be applied next.

When a material that is difficult to remove by the oxygen plasma is segregated to appear on the uppermost surface, etching using other gas species (for example, sputter etching using an argon ion beam, or reactive ion etching using a fluorine-based gas (for example, a $CF_4$ gas)) may be performed before the oxygen plasma treatment.

The etching performed using other gas species can remove the material that is segregated to appear on the uppermost surface and difficult to remove by the oxygen plasma. For example, in the case of using polydimethylsiloxane as the polymer B, polydimethylsiloxane is low in surface energy and is thus apt to be exposed to the uppermost surface. In this case, plasma treatment using the fluorine-based gas (for example, the $CF_4$ gas) performed before the oxygen plasma treatment can remove the layer of polydimethylsiloxane on the uppermost surface.

The oxygen plasma treatment performed thereafter can facilitate isolation of the domains 51b of the polymer B.

Figure 6:
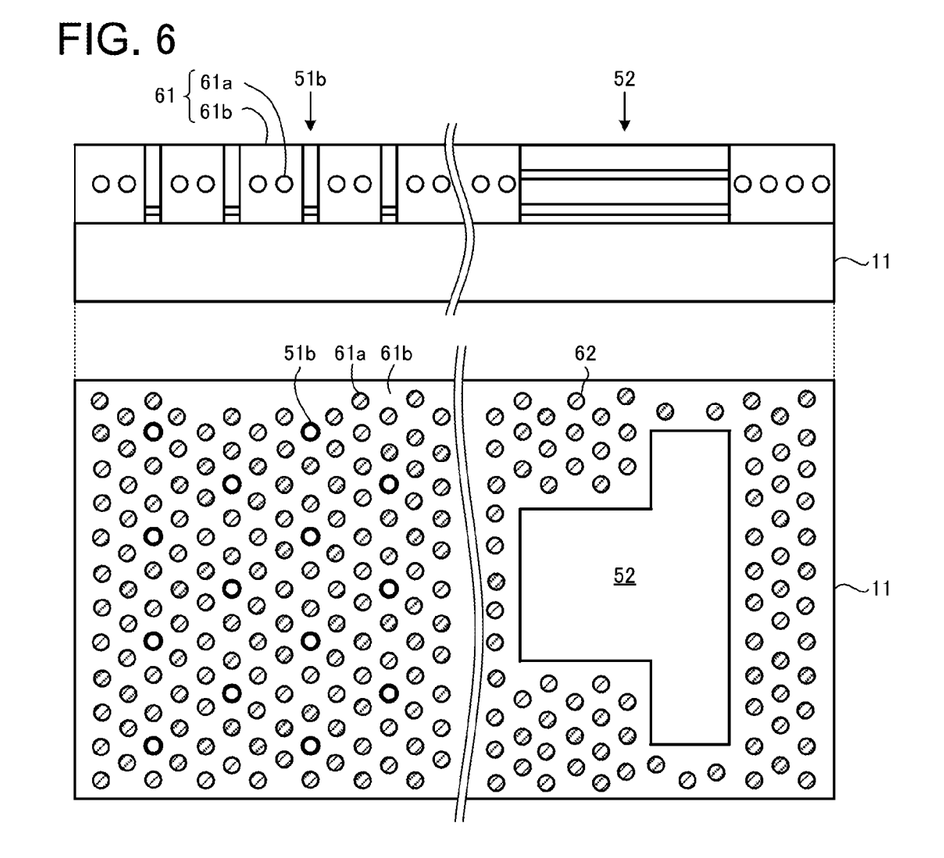
FIG. 6 is a top view and a sectional view illustrating the self-assembled pattern in process of production.

(5) Formation of a Regular Array with the Block Copolymer C-D (Step S15, see FIG. 6)

The block copolymer C-D composed of a polymer C and a polymer D can self-assemble using the isolated domains 51b of the polymer B as the guide pattern. The block copolymer C-D takes a dot structure in two dimensions and forms a regularly arrayed pattern whose array direction is controlled by the guide pattern of the domains 51b of the polymer B.

The polymer C is preferably removable by oxygen plasma. The polymer C can be selected from among carbon-based polymers such as polybutadiene, polymethyl methacrylate, polyethylene, poly-t-butyl methacrylate, polyisoprene, polystyrene, poly-N,N-dimethylacrylamide, polyethylene oxide, polyacrylic acid, polymethacrylic acid and so on.

The polymer D is preferably highly resistant to oxygen plasma. As the polymer D, a polymer in which a metal element such as silicon bonds to a main chain or a side chain, such as polydimethylsiloxane, polysilicon, silsesquioxane or the like can be selected.

Here, the volume fractions of the polymer D and the polymer B are preferably at the same level (substantially the same). In this case, the size of the dot (domain 51b) composed of the polymer B and the size of the dot (domain 61a) composed of the polymer D become substantially the same level. As a result of this, the dot size can be made almost uniform over the entire surface of the region where the recessed part 31 is formed.

That the volume fractions are at the same level (substantially the same) here means that the difference between the volume fractions of the polymer D and the polymer B is ±20% or less. With the difference at this level, the sameness in size between the domain 51b and the domain 61a is ensured. The difference between the volume fractions of the polymer D and the polymer B is more preferably ±10% or less.

The block copolymer (self-assembling material) may be a C-D type diblock copolymer or may be a C-D-C type or D-C-D type triblock copolymer.

1) Brush Processing with the Polymer C

It is preferable that, prior to the filling of the block copolymer, a brush film of the polymer C (layer of the polymer C) at the outer peripheries of the domains 51b of the polymer B and the lamellar structure 52. The formation of the brush film of the polymer C improves the affinity with the block copolymer C-D to facilitate stable self-assembly of the block copolymer C-D.

Specifically, the brush film of the polymer C can be formed as follows. By applying a solution of the polymer C to the substrate 11 and then heating, the brush film of the polymer C can be formed. Thereafter, a solvent is used to rinse the substrate 11 to thereby remove the excessive polymer C.

2) Filling of the Block Copolymer

The block copolymer C-D composed of the polymer C and the polymer D is filled around the domains 51b and the lamellar structure 52 of the polymer B. In other words, the block copolymer C-D is dissolved in an appropriate solvent and then applied onto the guide pattern such as the isolated domains 51b of the polymer B and so on to form a film of the block copolymer C-D.

3) Phase Separation of the Block Copolymer C-D (Self-Assembly)

The filled block copolymer C-D is phase-separated. The block copolymer is phase-separated by facilitating deformation of the block copolymer C-D by thermal annealing (heating) or exposure to a solvent atmosphere.

Thereafter, a phase separation structure is formed by annealing treatment by heating or annealing treatment in a solvent vapor atmosphere. As a result of this, the regularly arrayed pattern of the block copolymer C-D can be produced.

As illustrated in FIG. 6, structures 61, 62 which are almost same are formed around the fine pattern (hole pattern) and the wide pattern (recess pattern with a large size). Each of the structures 61, 62 has a domain 61a of the polymer D and a domain 61b surrounding the domain 61a. The domain 61a is produced taking the domain (columnar body) 51b as a reference and ensures accuracy.

The domains 61a, 62a are in the sphere structure (spherical shape) here but may be in the cylinder structure (column shape).

The substrate 11 is then subjected to oxygen plasma treatment. As a result of this, most of the polymer C (the polymer C forming the brush film and the domains of the polymer C in the block copolymer) is removed so that the domains 61a, 62a of the polymer D are left. In short, the isolated domains of the polymer D are formed.

In the above manner, the pattern can be reproduced using, as a template, the substrate 11 on which the domains of the polymer D are formed. A template may be produced from the substrate 11 and used to reproduce the pattern.

The guide pattern formed by the polymer B may be transferred here by etching or the like to a base transfer layer of the substrate 11 for use. In this case, the height of the guide pattern 12 on the substrate 11 can be uniformly formed depending on the thickness of the transfer layer.

The base transfer layer preferably takes a high etching selection ratio with the polymer B. For example, Si, Cr, carbon-based material can be used.

The base transfer layer when using Si exhibits a high etching rate with respect to SiOx of polysiloxane or the like used as the polymer B by the plasma treatment using gas of chlorine, $SF_6$, HBr or the like.

Further, the base transfer layer when using Cr exhibits a high etching rate with respect to the polymer B by the plasma treatment using a mixed gas of chlorine and oxygen or the like.

Further, a high etching rate with respect to the polymer B can be obtained by the oxygen plasma with respect to the carbon-based film such as carbon or the like. The transfer layer may be formed of a layered film composed of a plurality of layers.

As described above, it becomes possible in this embodiment to form a composite self-assembled pattern in which the diameter D is miniaturized to be the same level as the self-assembled pattern in the hole pattern part and a form not reflecting the structure of the self-assembly is maintained in the region of the large two-dimensional pattern.

Example 1

Example 1 is described later.

A. Production Procedure (1) Production of the Guide Pattern 12 on the Substrate 11

The guide pattern 12 of the resist layer was formed on the substrate 11. A Si substrate was used as the substrate, and ZEP520A was applied as the resist layer into a film thickness of 50 nm.

A fine pattern and a wide pattern were drawn on the resist layer. A hole pattern with a diameter of 30 nm and at a pitch of 60 nm was drawn in the form of a triangle grid by the electron-beam lithography apparatus (drawing of the fine pattern). A line-and-space pattern having a groove with a width of 100 nm and at a pitch of 160 nm was drawn at another place on the same substrate (drawing of the wide pattern).

The resist layer was developed with a developing solution (amyl acetate). Thereafter, isopropyl alcohol was used to rinse the substrate to thereby remove the developing solution, and then the substrate was dried.

The guide pattern 12 of the resist layer (ZEP520A) was formed on the substrate 11 as described above.

(2) Brush Processing with the Polymer A

Thereafter, the substrate 11 was subjected to the brush processing with the polymer A.

Prior to the brush processing, a carbon film was formed to be 5 nm on the surface of the resist layer by the sputtering method. Thereafter, an ultraviolet lamp radiated for 1 min in air to produce a protective film for protecting the resist layer from the solvent (propylene glycol monoethyl acetate).

Then, a solution made by dissolving polystyrene (having a molecular weight of 5000) having a terminal modified with the hydroxy group in propylene glycol monoethyl acetate was applied by spin coating. Thereafter, the substrate 11 was subjected to annealing for 20 hours at 170 degrees in vacuum and thereby subjected to the brush processing with polystyrene. Note that propylene glycol monoethyl acetate was used to rinse the substrate after the annealing to thereby remove the excessive polystyrene.

(3) Hole Shrink with the Block Copolymer A-B

Then, polystyrene-polydimethylsiloxane (each having a molecular weight of 5000) was applied as a propylene glycol monoethyl acetate solution by spin coating. Thereafter, the substrate 11 was subjected to annealing for 20 hours at 170 degrees in vacuum.

(4) Oxygen Plasma Treatment

Then, plasma treatment with a $CF_4$ gas was carried out for 10 seconds, and then oxygen plasma treatment was carried out for 100 seconds to remove the resist layer, the carbon film and polystyrene.

(5) Brush Processing with the Polymer C

Then, a solution made by dissolving polystyrene (having a molecular weight of 5000) having a terminal modified with the hydroxy group in propylene glycol monoethyl acetate was applied by spin coating. Thereafter, the substrate 11 was subjected to annealing for 20 hours at 170 degrees in vacuum and thereby subjected to the brush processing with polystyrene.

(6) Formation of a Regular Array with the Block Copolymer C-D

Then, polystyrene-polydimethylsiloxane (having molecular weights of 10000 and 3000 respectively) was applied as a propylene glycol monoethyl acetate solution by spin coating.

Thereafter, the substrate 11 was subjected to annealing treatment for 20 hours at 170 degrees in vacuum.

(7) Oxygen Plasma Treatment

After the annealing, plasma treatment with a $CF_4$ gas was further carried out for 10 seconds, and oxygen plasma treatment was carried out for 50 seconds.

B. Evaluation

The self-assembled pattern was verified. In the region where the hole pattern was formed, a pattern of dots arrayed in a closest filled manner in two dimensions at a pitch of 20 nm was verified on the entire surface. In the region where the line-and-space pattern with a width of 80 nm and at a pitch of 160 nm was formed, a line with a width of 80 nm having dots at a pitch of 20 nm arrayed therein and a projecting land part with a width of 80 nm were verified.

As described above, both of the fine pattern and the wide pattern were able to be formed.

Comparable Example 1

Comparative Example 1 is described later.

A. Production

Polystyrene-polydimethylsiloxane (having molecular weights of 10000 and 5000 respectively) was used. A self-assembled pattern was produced by the same procedure as that in Example 1 except the above.

B. Evaluation

Figure 7:
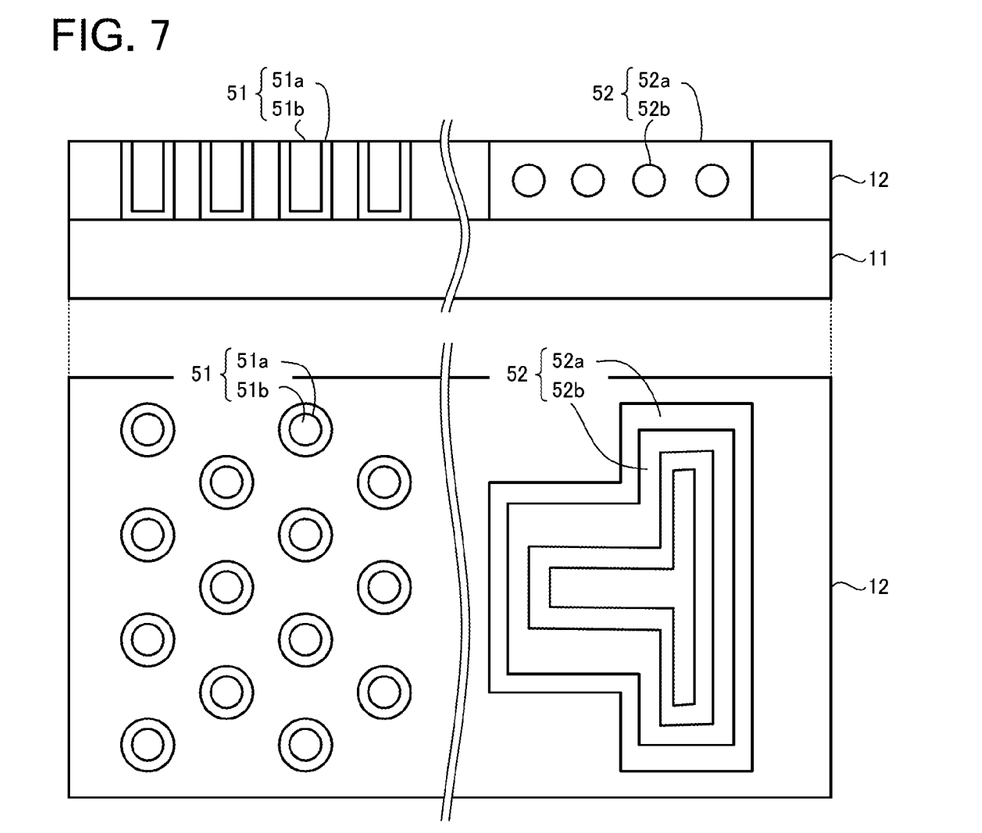
FIG. 7 a top view and a sectional view illustrating self-assembled pattern according to a comparative example.

A schematic view of the structure observed when the block copolymer A-B (polystyrene-polydimethylsiloxane) was phase-separated is illustrated in FIG. 7. Note that the illustration of the brush film is omitted in this drawing.

Verification of the self-assembled pattern shows that, in the region where the hole pattern was formed, a pattern of dots arrayed in a closest filled manner in two dimensions at a pitch of 20 nm was verified on the entire surface. In the region where the line-and-space pattern with a width of 100 nm and at a pitch of 160 nm was formed, a pattern like a maze was verified which was composed of a line with a width of 80 nm having dots at a pitch of 20 nm arrayed therein and a line-and-space at a pitch of 20 nm in a region with a width of 80 nm. In other words, the wide pattern was not maintained intact.

Comparative Example 2

Comparative Example 2 is described later.

A. Production

A self-assembled pattern was produced by the same procedure as that in Example 1 except that polystyrene-polydimethylsiloxane (having molecular weights of 10000 and 2000 respectively) were used.

B. Evaluation

Figure 8:
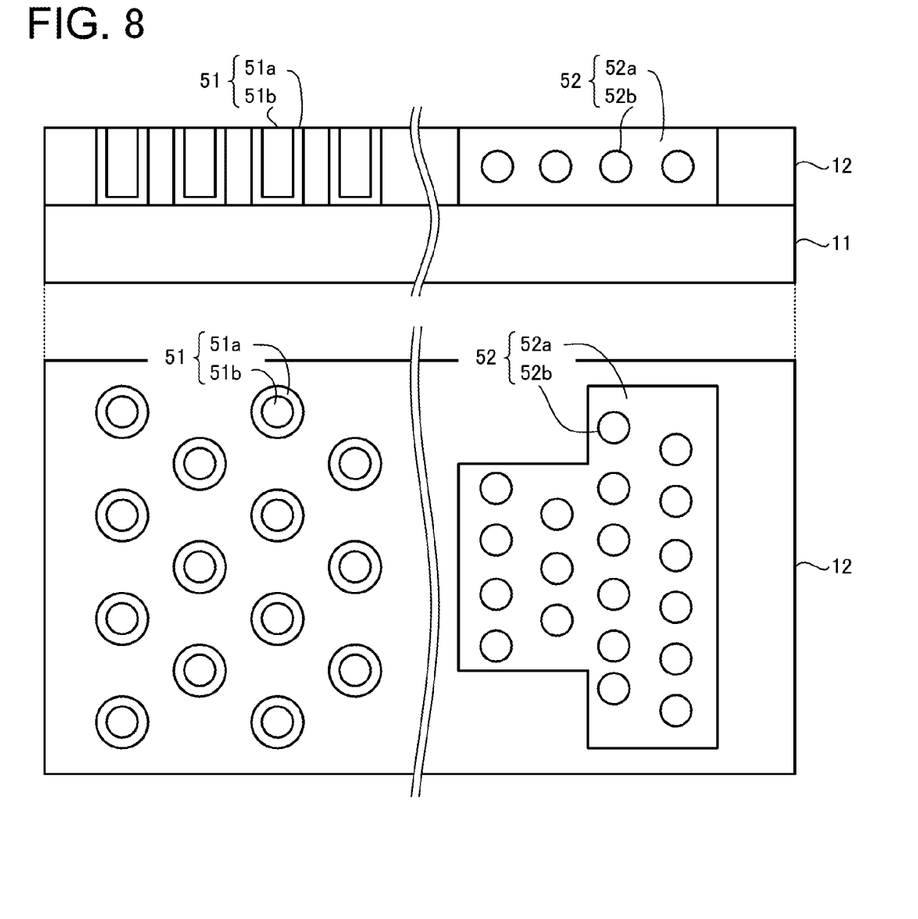
FIG. 8 a top view and a sectional view illustrating self-assembled pattern according to a comparative example.

A schematic view of the structure observed when the block copolymer A-B (polystyrene-polydimethylsiloxane) was phase-separated is illustrated in FIG. 8. Note that the illustration of the brush film is omitted in this drawing.

Verification of the self-assembled pattern shows that, in the region where the hole pattern was formed, a pattern of dots arrayed in a closest filled manner in two dimensions at a pitch of 20 nm was verified on the entire surface. Also in the region where the line-and-space pattern with a width of 100 nm and at a pitch of 160 nm was formed, a pattern in which dots at a pitch of 20 nm randomly arrayed was verified. In other words, the wide pattern was not maintained intact.

Example 2

Example 2 is described later.

A. Production

A substrate 11 in which an HSQ film was produced to be 20 nm on a Si substrate and a film of carbon was further formed by the sputtering method on the HSQ film was used. A self-assembled pattern was formed by the same procedure as that in Example 1 except the above.

Incidentally, after the resist layer, the carbon film and polystyrene were removed, the substrate 11 was subjected to etching for 100 seconds with plasma of a $CF_4$ gas, and the pattern was transferred to the HSQ layer. Thereafter, the substrate 11 was further exposed to oxygen plasma for 20 seconds.

B. Evaluation

The self-assembled pattern was verified. In the region where the hole pattern was formed, a pattern of dots arrayed in a closest filled manner in two dimensions at a pitch of 20 nm was verified on the entire surface. In the region where the line-and-space pattern with a width of 80 nm and at a pitch of 160 nm was formed, a line with a width of 80 nm having dots at a pitch of 20 nm arrayed therein and a projecting land part with a width of 80 nm were verified.

While certain embodiments have been described, these embodiments have been presented by way of example only, and are not intended to limit the scope of the inventions. Indeed, the novel embodiment described herein may be embodiment in a variety of other forms; furthermore, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A self-assembled pattern forming method, comprising:
   forming on a substrate a guide pattern including a first recessed part having a depth T and a diameter D smaller than the depth T, and a second recessed part having a width L larger than double of the diameter D;
   forming a layer of a first polymer on inner walls of the first and second recessed parts, wherein the first polymer is polybutadiene, polymethyl methacrylate, polyethylene, poly-t-butyl methacrylate, polyisoprene, polystyrene, poly-N,N-dimethylacrylamide, polyethylene oxide, polyacrylic acid, or polymethacrylic acid;
   filling a first block copolymer having the first polymer and a second polymer which are substantially the same in volume fraction, inside the first and second recessed parts; and
   phase-separating the first block copolymer to obtain a cylinder structure disposed inside the first recessed part and having a columnar body of the second polymer and a cover body of the first polymer surrounding the columnar body, and a lamellar structure disposed inside the second recessed part and having layers of the first and second polymers.

2. The self-assembled pattern forming method according to claim 1,
   wherein the second recessed part has a plurality of widths, and the width L has the minimum value among the plurality of widths.

3. The self-assembled pattern forming method according to claim 1,
   wherein the first polymer has a hydroxy group, a carboxyl group, an amino group, or a trimethoxysilane group at a terminal of a polymer chain.

4. The self-assembled pattern forming method according to claim 1,
wherein the step of phase-separating includes annealing the first block copolymer.

5. A self-assembled pattern forming method, comprising:
forming on a substrate a guide pattern including a first recessed part having a depth T and a diameter D smaller than the depth T, and a second recessed part having a width L larger than double of the diameter D;
forming a layer of a first polymer on inner walls of the first and second recessed parts;
filling a first block copolymer having the first polymer and a second polymer which are substantially the same in volume fraction, inside the first and second recessed parts, wherein the second polymer is a silicon-based polymer; and
phase-separating the first block copolymer to obtain a cylinder structure disposed inside the first recessed part and having a columnar body of the second polymer and a cover body of the first polymer surrounding the columnar body, and a lamellar structure disposed inside the second recessed part and having layers of the first and second polymers.

6. The self-assembled pattern forming method according to claim 5,
wherein the second polymer is a polydimethylsiloxane, a polysilicon, or a silsesquioxane.

7. A self-assembled pattern forming method, comprising:
forming on a substrate a guide pattern including a first recessed part having a depth T and a diameter D smaller than the depth T, and a second recessed part having a width L larger than double of the diameter D;
forming a layer of a first polymer on inner walls of the first and second recessed parts;
filling a first block copolymer having the first polymer and a second polymer which are substantially the same in volume fraction, inside the first and second recessed parts; and
phase-separating the first block copolymer to obtain a cylinder structure disposed inside the first recessed part and having a columnar body of the second polymer and a cover body of the first polymer surrounding the columnar body, and a lamellar structure disposed inside the second recessed part and having layers of the first and second polymers,
wherein a ratio (V1/V2) between a volume V1 of the first polymer film and a volume V2 of the first polymer of the first block copolymer inside the first recessed part is one or more and five or less.

8. A self-assembled pattern forming method, comprising:
forming on a substrate a guide pattern including a first recessed part having a depth T and a diameter D smaller than the depth T, and a second recessed part having a width L larger than double of the diameter D;
forming a layer of a first polymer on inner walls of the first and second recessed parts;
filling a first block copolymer having the first polymer and a second polymer which are substantially the same in volume fraction, inside the first and second recessed parts; and
phase-separating the first block copolymer to obtain a cylinder structure disposed inside the first recessed part and having a columnar body of the second polymer and a cover body of the first polymer surrounding the columnar body, and a lamellar structure disposed inside the second recessed part and having layers of the first and second polymers; and
removing the guide pattern and the cover body by oxygen plasma treatment to leave the columnar body and the lamellar structure.

9. The self-assembled pattern forming method according to claim 8, further comprising
before the removing the guide pattern and the cover body, performing plasma treatment with an argon gas or a fluorine-based gas.

10. The self-assembled pattern forming method according to claim 8,
wherein the substrate comprises a transfer layer; and
wherein the method further comprises:
after the removing the guide pattern and the cover body of the cylinder structure, etching the transfer layer using the columnar body of the cylinder structure and the lamellar structure as a mask.

11. The self-assembled pattern forming method according to claim 8, further comprising
forming a layer of a third polymer on an outer periphery of the columnar body.

12. The self-assembled pattern forming method according to claim 11, further comprising
filling a second block copolymer having the third polymer and a fourth polymer around the columnar structure and the lamellar structure.

13. The self-assembled pattern forming method according to claim 12,
wherein a volume fraction of the second polymer is substantially the same as a volume fraction of the fourth polymer.

14. The self-assembled pattern forming method according to claim 12,
wherein the third polymer is comprised of a carbon-based material, and the fourth polymer is comprised of a silicon-based polymer.

15. The self-assembled pattern forming method according to claim 14,
wherein the third polymer has a hydroxy group, a carboxyl group, an amino group, or a trimethoxysilane group at a terminal of a polymer chain.

16. The self-assembled pattern forming method according to claim 14,
wherein the fourth polymer is a polydimethylsiloxane, a polysilicon, or a silsesquioxane.

17. The self-assembled pattern forming method according to claim 12, further comprising
phase-separating the second block copolymer to form a cylinder structure or a sphere structure having a columnar body or a spherical body of the fourth polymer and a cover body of the third polymer surrounding the columnar body or the spherical body.

18. The self-assembled pattern forming method according to claim 17, further comprising
removing the cover body of the third polymer by oxygen plasma treatment to leave the columnar body or the spherical body of the fourth polymer.

* * * * *